(12) United States Patent
Chung et al.

(10) Patent No.: US 7,557,665 B2
(45) Date of Patent: Jul. 7, 2009

(54) TEMPERATURE TRACKING OSCILLATOR CIRCUIT

(75) Inventors: Shine Chung, Taipei (TW); Jonathan Hung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 11/717,403

(22) Filed: Mar. 13, 2007

(65) Prior Publication Data

US 2008/0224785 A1 Sep. 18, 2008

(51) Int. Cl.
*H03K 3/02* (2006.01)
(52) U.S. Cl. ............... 331/66; 331/143; 365/211; 365/222
(58) Field of Classification Search .............. 331/66, 331/111, 143; 365/211, 222
See application file for complete search history.

(56) References Cited

U.S. PATENT DOCUMENTS

| 5,699,024 | A | * | 12/1997 | Manlove et al. ............. 331/111 |
| 6,876,250 | B2 | * | 4/2005 | Hsu et al. ..................... 327/539 |
| 7,236,061 | B2 | * | 6/2007 | Lin ............................... 331/66 |
| 2007/0146010 | A1 | * | 6/2007 | Isobe ............................ 326/83 |
| 2008/0042736 | A1 | * | 2/2008 | Byeon ......................... 327/539 |

FOREIGN PATENT DOCUMENTS

JP     2000-048561     2/2000

* cited by examiner

*Primary Examiner*—Robert Pascal
*Assistant Examiner*—Levi Gannon
(74) *Attorney, Agent, or Firm*—Slater & Matsil, L.L.P.

(57) ABSTRACT

A temperature-dependent oscillator includes a first current source, wherein a first current provided by the first current source has a positive temperature coefficient, a second current source serially connected to the first current source, wherein a second current provided by the second current source has a negative temperature coefficient, and a capacitor serially connected to the first current source and parallel connected to the second current source.

24 Claims, 3 Drawing Sheets

US 7,557,665 B2

TEMPERATURE TRACKING OSCILLATOR CIRCUIT

TECHNICAL FIELD

This invention relates generally to oscillators, and even more particularly to oscillators having temperature-dependent frequencies.

BACKGROUND

Dynamic random access memories (DRAM) are commonly used in modern integrated circuits. DRAMs need to be periodically refreshed in order to keep the stored information from being lost. The refresh is typically performed by refresh circuits, namely periodically reading cells that involves using oscillators.

FIG. 1 illustrates a conventional oscillator circuit. In an initial stage, a MOS device M0 is off. A current source CS1 provides a current for charging a capacitor C1, causing an increase in voltage V1. When voltage V1 is higher than the trip point of inverter G0, the states of inverters G0 and G1 flip. MOS device M0 is thus turned on, and charge stored in capacitor C1 is discharged. The discharging causes the lowering of voltage V1, and eventually another flip of the states of inverters G0 and G1. The charging process then starts again. The repeated charging and discharging results in voltage V1 having a saw-tooth waveform, and output voltage Vout having a square waveform. Output voltage Vout can be used to refresh DRAMs.

One of the reasons causing the states stored in DRAMs to be lost is leakage current. For example, a typical DRAM cell may include a capacitor and a transistor, wherein the state is stored by charging or discharging the capacitor. Leakage currents, however, will cause the stored charges to leak away. The leakage current is related to temperature, and when the temperature increases, the leakage current also increases. Accordingly, the DRAMs need to be refreshed more frequently, hence higher refresh rates are required at higher temperatures.

Conventionally, to ensure the correct operation of DRAMs at high temperatures, the refresh rate is set to a high level so that at a high temperature, the refresh rate can still satisfy the increased demand of refreshing. The increased refresh rate, however, causes more power to be consumed. Higher-than-necessary refresh rates at low temperatures cause an undesired increase in power consumption. Therefore, the optimal design is that the oscillators are temperature dependent, which means oscillators need to provide high refresh rates at high temperatures and low refresh rates at low temperatures. In this way, the requirements of data integrity and power consumption are balanced.

FIG. 2 schematically illustrates the period of an oscillator as a function of temperature. The Y-axis (Tref) indicates the periods of cycles of the oscillator. A DRAM refresh oscillator should not perform in forbidden region 2 due to the long periods of refresh cycles, and hence the states stored in DRAMs may be lost before next refresh. The oscillator should also not perform in forbidden region 4 due to the over-refresh rate, and hence needless power consumption. Region 6 is the preferred work region for oscillators. It can be estimated from FIG. 2 that the optimal refresh rate at 125° C. may be about 6 to 8 times higher than the refresh rate at 25° C.

Conventionally, to implement temperature-dependent oscillators, temperatures are detected first and then used to operate a digital circuit, which generates refresh signals based upon the detected temperatures. The detected temperatures are typically divided into segments, and several refresh rates may be generated by the digital circuit, each corresponding to a segment of the temperature range. It is obvious that within a temperature segment, the refresh rate is not temperature dependent, and thus this approach is not optimal.

Therefore, what is needed in the art is a fully temperature-dependent oscillator.

SUMMARY OF THE INVENTION

In accordance with one aspect of the present invention, an oscillator having a temperature-dependent frequency includes a first current source, wherein a first current provided by the first current source has a positive temperature coefficient; a second current source serially connected to the first current source, wherein a second current provided by the second current source has a negative temperature coefficient; and a capacitor serially connected to the first current source and parallel connected to the second current source.

In accordance with another aspect of the present invention, an oscillator having a temperature-dependent frequency includes a first current source generating a first current having a positive temperature coefficient; a second current source sinking a portion of the first current, wherein the portion of the first current is a second current having a negative temperature coefficient; a capacitor charged by a remaining current of the first current subtracted by the second current; and a control circuit providing a discharging path for the capacitor after the capacitor is charged, wherein the discharging path is turned off after the capacitor is discharged.

In accordance with yet another aspect of the present invention, an oscillator having a temperature-dependent frequency includes a first and a second current source. The first current source includes a first current path comprising a first MOS device serially coupled to a first diode and a first resistor; a second current path comprising a second MOS device serially coupled to a second diode, wherein the first diode has an area greater than an area of the second diode; and an operational amplifier having a first input connected to the first current path; a second input connected to the second current path; and an output connected to gates of the first and the second MOS devices. The first current source further includes a third MOS device having a gate connected to the gates of the first and the second MOS devices, and a source coupled to a power source. The second current source includes a third diode serially connected to a resistive electrical device, wherein a node between the third diode and the resistive electrical device is at a reference voltage; a circuit converting the reference voltage proportionally to a reference current; and a fourth MOS device generating a circuit proportional to the reference current, wherein a drain of the fourth MOS device is connected to a drain of the third MOS device. The oscillator further includes a capacitor having a first end connected to the drains of the third and the fourth MOS devices, and a second end coupled to ground.

In accordance with yet another aspect of the present invention, a method for generating a temperature-dependent oscillating signal includes generating a first current having a positive temperature coefficient; generating a second current having a negative temperature coefficient; and subtracting the second current from the first current to generate a third current.

The present invention provides a fully temperature-dependent oscillator for refreshing memory cells.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel temperature-dependent oscillator is provided. The variations and operations of the preferred embodiments are discussed. Throughout the various views and illustrative embodiments of the present invention, like reference numbers are used to designate like elements.

Figure 1:
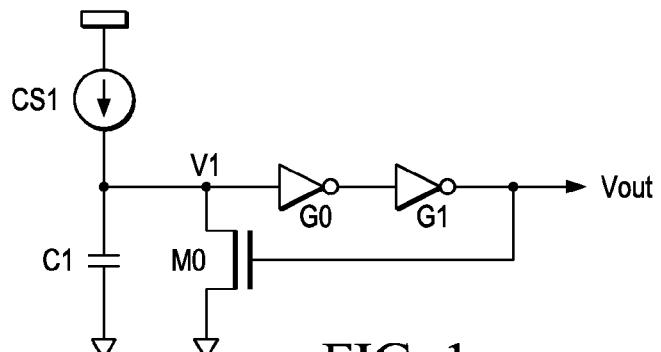
FIG. 1 illustrates a conventional oscillator.
Figure 2:
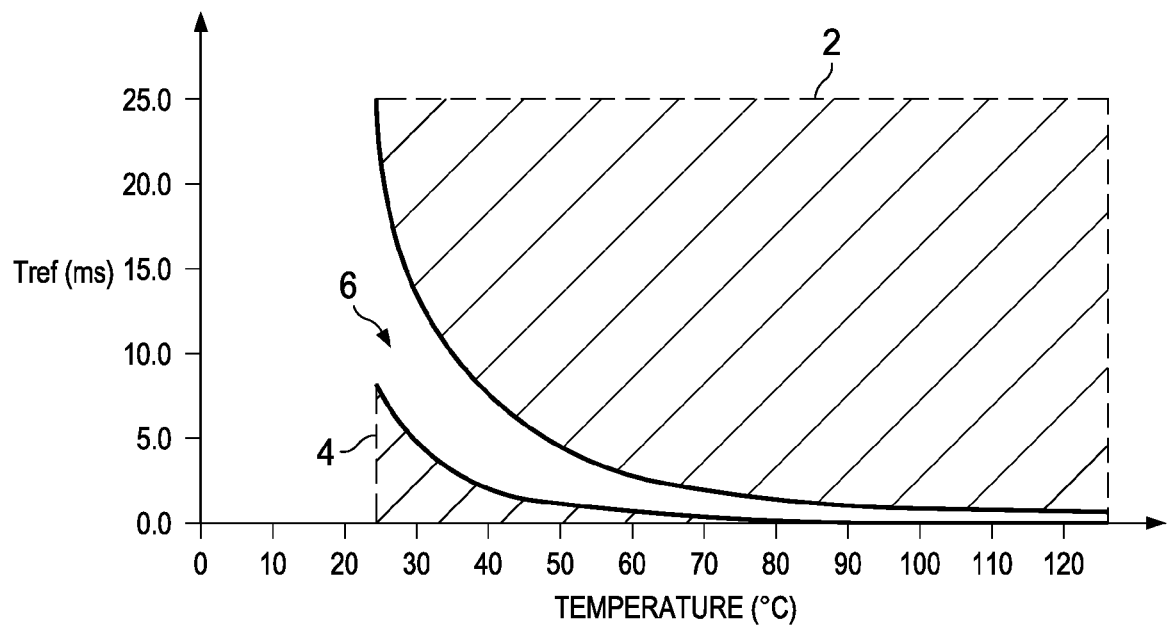
FIG. 2 schematically illustrates preferred work ranges of oscillators.
Figure 3:
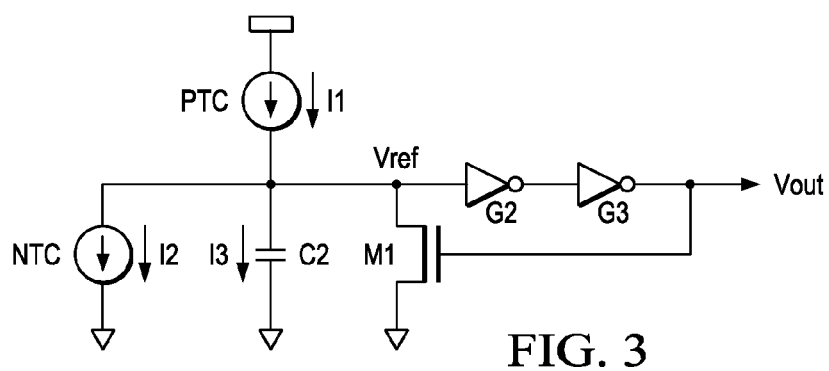
FIG. 3 illustrates a schematic circuit diagram of an embodiment of the present invention.

FIG. 3 illustrates a schematic circuit diagram of an oscillator embodiment. The oscillator includes a capacitor C2 for storing charges. A current source PTC is used to provide a current I1. Current source PTC preferably has a positive temperature coefficient (PTC), which means that current I1 provided by current source PTC increases with the increase in temperature. More preferably, current I1 provided by current source PTC is proportional to absolute temperature (PTAT), hence current source PTC is sometimes referred to as current source PTAT. A portion of the current I1 is sunk by current source NTC. Current source NTC preferably has a negative temperature coefficient (NTC), which means that current I2 decreases with the increase in temperature. The net current I3, which equals (I1−I2), is used to charge capacitor C2.

The oscillator also includes other circuitry for controlling the charging and discharging of capacitor C2. FIG. 3 illustrates an exemplary control circuit, which includes an NMOS device M1. In an initial stage of the charging process, a low voltage Vout is provided to the gate of MOS device M1, and thus no current flows through MOS device M1. With the charging of capacitor C2, voltage Vref increases. When voltage Vref reaches the trip point of inverter G2, inverters G2 and G3 flip, and output voltage Vout becomes high. Since the voltage at the gate of MOS device M1 equals Vout, MOS device M1 is turned on. Capacitor C2 is thus discharged through MOS device M1, and voltage Vref decreases. When the voltage Vref is low enough, inverters G2 and G3 flip again, and voltage Vout becomes low. MOS device M1 is thus turned off, and another cycle is started to charge capacitor C2. Accordingly, output voltage Vout oscillates between high and low voltages. Since the charging current I3 is temperature-dependent (temperature-tracking), the cycle for output voltage Vout is also temperature-tracking. It is to be realized that the control circuit for controlling charging and discharging is only an example, and can be implemented in many different ways.

Figure 4:
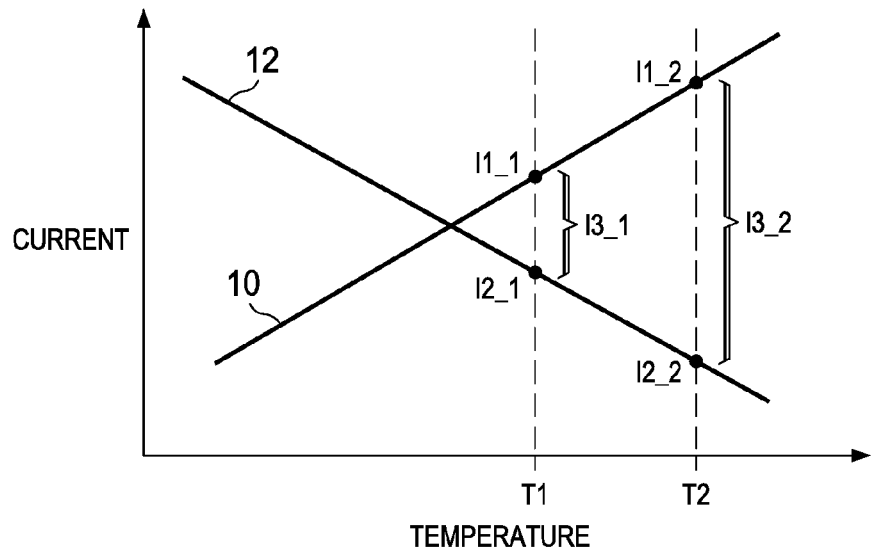
FIG. 4 schematically illustrates currents of the current sources in FIG. 3 as a function of temperature.

From the above discussion, it can be found that the charging time is related to the magnitude of charging current I3. The higher the charging current I3 is, the faster the voltage Vref can be charged to the trip point. As a result, the refresh rate (also refer to as frequency throughout the description) provided by the oscillator is higher. FIG. 4 schematically illustrates currents as a function of temperature, wherein line 10 illustrates the current I1 of PTC, and line 12 illustrates current I2 of NTC. It is to be noted that for simplicity of illustration, I1 is illustrated as proportional to absolute temperature and I2 is illustrated as proportional to absolute temperature with a negative slope. However, in practical circuits, lines 10 and 12 may have other shapes, although the trend of each line still holds.

Assuming during a charging process, at a first temperature T1, current I1 of current source PTC is I1_1, while current I2 of current source NTC is I2_1. The net current I3_1, which flows through capacitor C2 (refer to FIG. 3), equals (I1_1−I2_1). At a second temperature T2, current I1 of current source PTC is I1_2, while current I2 of current source NTC is I2_2. The net current I3_2 equals (I1_2−I2_2). With current source PTC having a positive temperature coefficient and current source NTC having a negative temperature coefficient, current I3_2 is greater than current I3_1, hence current I3 also has a positive temperature coefficient. FIG. 4 also reveals an advantageous feature of embodiments of the present invention. The ratios of currents at different temperatures are magnified significantly relative to that of PTCs. For example, the charging current I3 at 125° C. may be several times, for example, up to about six to eight times greater than the charging current I3 at 25° C. As a comparison, for an ideal PTAT, the current ratio of a charging current at 125° to a charging current at 25° C. is only (273+125)/(273+25), which is about 1.34.

Figure 5:
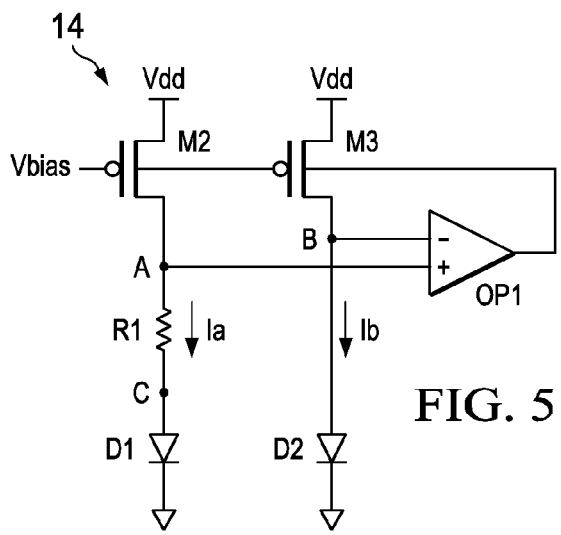
FIG. 5 illustrates a circuit diagram of an exemplary current source having a positive temperature coefficient.

The concept provided in FIG. 3 can be implemented through various implementations. An exemplary implementation is provided in FIGS. 5 through 8. FIG. 5 illustrates a circuit diagram of a circuit 14 for providing a current with a positive temperature coefficient. Throughout the description, circuit 14 is referred to as PTC circuit 14. PTC circuit 14 includes PMOS devices M2 and M3, which are connected to an operation voltage Vdd. The drain of PMOS device M2 is connected to resistor R1, which is further connected to a diode D1. The drain of PMOS device M3 is connected to diode D2. Diodes D1 and D2 may be connected to ground. Nodes A and B are connected to inputs of an operational amplifier OP1. The output of operational amplifier OP1 is connected to the gates of the PMOS devices M2 and M3.

PTC 14 forms a self-biased circuit. The self-bias voltage Vbias is generated at the output of operation amplifier OP1, and is used to bias PMOS devices M2 and M3, preferably in their respective saturation regions. Diode D1 preferably has a greater saturation current that diode D2, and the ratio of the saturation current of diode D1 relative to the saturation current of diode D2 is represented as N. In an exemplary embodiment for achieving a higher saturation current, an area of diode D1 is greater than an area of diode D2 with an area ratio of N, which is in the range of between about 8 and about 100, and more preferably about 8. The current Ia flowing through diode D1 can be expressed as:

$$Ia=I0*N*\exp(q*Vc/(kT)) \quad [\text{Eq. 1}]$$

wherein I0*N is the saturation current of diode D1, Vc is the voltage at node C, q is the electron charge, k is the Boltzmann's constant, and T is absolute temperature.

The current Ib flowing through diode D2 can be expressed as:

$$Ib=I0*\exp(q*Vb/(kT)) \quad [\text{Eq. 2}]$$

wherein I0 is the saturation current of diode D2, and Vb is the voltage at node B.

Due to the virtual connection property of operational amplifier OP1, voltage Va at node A is equal to voltage Vb at node b. Further using the relationship of:

$$Va=Ia*R1+Vc \quad [\text{Eq. 3}]$$

wherein R1 is the resistance of resistor R1, the following relationship can be obtained:

$$(kT)/q*\ln(Ib/I0)=(kT)/q*\ln(Ia/N*I0))+Ia*R1 \quad [\text{Eq. 4}]$$

Equation 4 can be simplified as:

$$Ia=\ln(N)*(kT)/(q*R1) \quad [\text{Eq. 5}]$$

Therefore, with N greater than 1, the current Ia is proportional to absolute temperature T, and thus PTC circuit 14 is also a PTAT circuit.

Figure 6A:
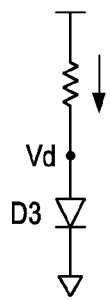
FIGS. 6A and 6B are exemplary circuits for providing voltages having negative temperature coefficients.
Figure 6B:
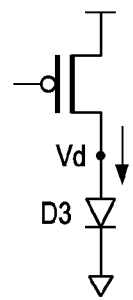
Figure 7:
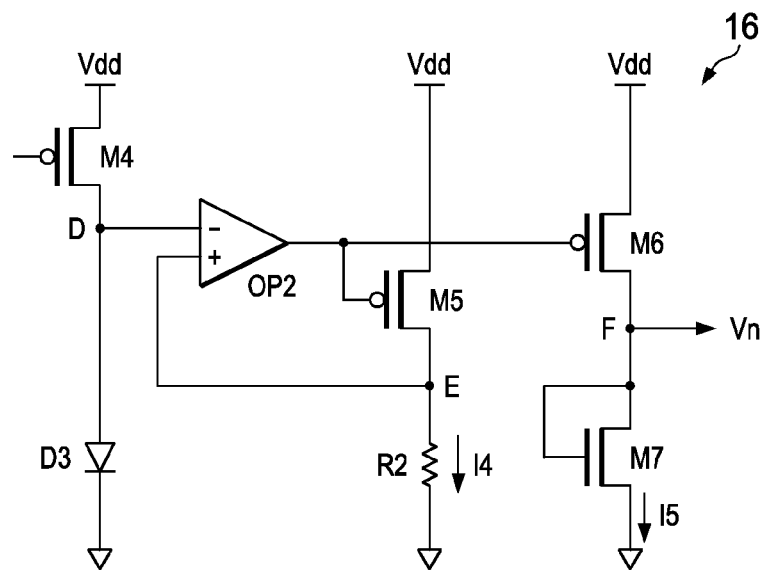
FIG. 7 illustrates a circuit of an exemplary current source having a negative temperature coefficient.

FIGS. 6A, 6B and 7 illustrate implementations of current source NTC (refer to FIG. 3). FIGS. 6A and 6B are embodiments for generating voltages having negative temperature dependence. Both circuits illustrated in FIGS. 6A and 6B include diode D3. As is known in the art, if a diode is serially connected to a resistive electrical device, the voltage drop on the diode has a negative temperature coefficient. In an exemplary embodiment, the negative temperature coefficient is about −1.5 mV/C. Therefore, the voltage Vd in both FIGS. 6A and 6B has a negative temperature coefficients.

FIG. 7 illustrates circuit 16 for generating a voltage with a negative temperature coefficient and converting the voltage to a current with a negative temperature coefficient. Throughout the description, circuit 16 is alternatively referred to as NTC circuit 16. NTC circuit 16 includes a PMOS device M4, whose drain is connected to diode D3. PMOS device M4 and diode D3 are corresponding to the circuit illustrated in FIG. 6B. Accordingly, Vd at node D has a negative temperature coefficient. Node D is further connected to an input of operational amplifier OP2, while the other input of operational amplifier OP2 is connected to a node E, which is further connected to resistor R2. Since input nodes D and E of operational amplifier OP2 are virtually connected, the voltage Vd at node D and voltage Ve at node E are forced to be equal to each other. Ve thus has a negative temperature coefficient. Current I4, which flows through resistor R2, thus has a value of Vd/R2, hence has a negative temperature coefficient.

In the preferred embodiment, current I4 is converted to current I5, which is referenced to ground. The conversion is implemented using PMOS devices M5, M6 and NMOS device M7. The gates of PMOS devices M5, M6 are connected to each other, and are both connected to the output of operational amplifier OP2. Therefore, current I4 is mirrored to current I5, which flows through PMOS device M6. Accordingly, current I5 is proportional to current I4. If PMOS devices M5 and M6 have a same size, current I6 may even be equal to current I5. As a result, current I6 also has a negative temperature coefficient. The node F will have a voltage Vn.

Therefore, current I5 having a negative temperature coefficient is generated by NTC circuit 16.

Figure 8:
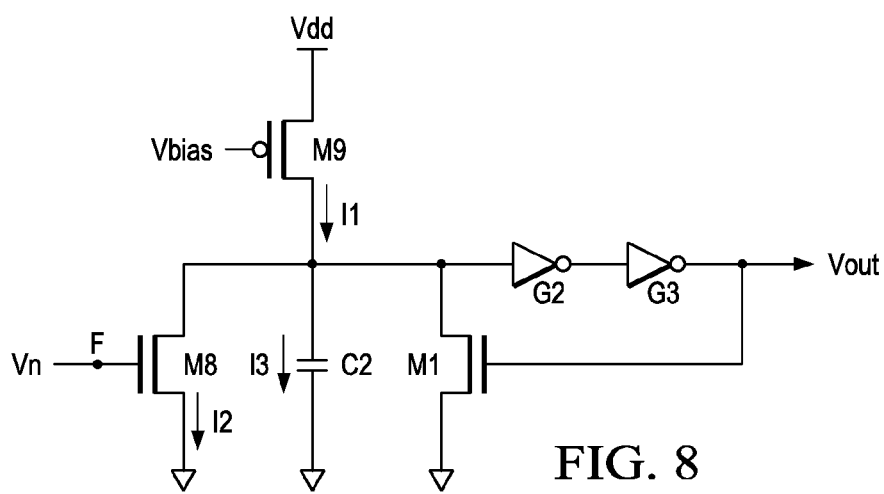
FIG. 8 illustrates a circuit implementing the circuit illustrated in FIG. 3.

FIG. 8 illustrates how PTC circuit 14 (in FIG. 5) and NTC circuit 16 (in FIG. 7) are integrated into the current source PTC and current source NTC in FIG. 3, respectively. The current source PTC in FIG. 3 includes a PMOS device M9 and PTC circuit 14. For simplicity, PTC circuit 14 is omitted. The gate of PMOS device M9 is connected to gates of PMOS devices M2 and M3 (refer to FIG. 5), and thus the voltage at the gate of PMOS device M9 is equal to bias voltage Vbias.

Due to the mirror effects, current I1, which flows through PMOS device M9, is proportional to current Ia (refer to FIG. 5). As discussed in preceding paragraphs, current Ia has a positive temperature coefficient. As a result, current I1 has a positive temperature coefficient.

Current source NTC in FIG. 3 includes an NMOS device M8 and the NTC circuit 16 as illustrated in FIG. 7. For simplicity, NTC circuit 16 is omitted. The gate of NMOS device M8 is connected to Node F in FIG. 7, thus they have a same bias voltage Vn. Due to the mirror effects, the current I2, which flows through NMOS device M8, is proportional to current I5 (refer to FIG. 7). As discussed in preceding paragraphs, current I5 has a negative temperature coefficient. As a result, current I2 also has a negative temperature coefficient.

It is observed that capacitor C2 is charged by net current I3, which equals current I1 subtracted by current I2. Current I3 thus has a positive temperature coefficient. Accordingly, the oscillator illustrated in FIG. 8 has a positive temperature coefficient. In experiments, at 125° C., the circuit in FIG. 8 may provide a charging current of about several micro-amps, which may be about ten times the charging current at 25° C.

It is appreciated that present invention may be implemented using various circuits by applying the concept of present invention. The embodiment provided in preceding paragraphs merely provides basic functions. More circuits may be added to fine-tune the performance of the embodiments of the present invention based on the design requirements.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An oscillator having a temperature-dependent frequency, the oscillator comprising:
   a first current source, wherein a first current provided by the first current source has a positive temperature coefficient;
   a second current source serially connected to and receiving current from the first current source, wherein a second current provided by the second current source is less than the first current and has a negative temperature coefficient; and a capacitor serially connected to the first current source and parallel connected to the second current source and receiving charging current with a positive temperature coefficient, the charging current being the difference between the first and second currents.

2. The oscillator of claim 1, wherein the first current is substantially proportional to absolute temperature.

3. The oscillator of claim 1, wherein the first current source comprises a first circuit generating a third current having a positive temperature coefficient, and a second circuit mirroring the third current to the first current.

4. The oscillator of claim 1, wherein the second current source comprises a first circuit for generating a voltage having a negative temperature coefficient, and a second circuit for converting the voltage into a current having a negative temperature coefficient.

5. The oscillator of claim 4, wherein the first circuit comprises a diode connected in series with a resistive electrical device, and wherein the voltage is a voltage drop on the diode.

6. The oscillator of claim 1 further comprising a control circuit inputting a capacitor voltage at a node between the first current source and the capacitor, and providing a discharging path for the capacitor, wherein the discharging path is controlled by the capacitor voltage.

7. The oscillator of claim 6, wherein when the discharging path is closed, the first current is only divided into the second current and the charging current for charging the capacitor.

8. An oscillator having a temperature-dependent frequency, the oscillator comprising:

a first current source generating a first current having a positive temperature coefficient;

a second current source sinking a portion of the first current, wherein the portion of the first current is a second current having a negative temperature coefficient;

a capacitor charged by a remaining temperature dependent current of the first current subtracted by the second current; and a control circuit providing a discharging path for the capacitor after the capacitor is charged, wherein the discharging path is turned off after the capacitor is discharged.

9. The oscillator of claim 8, wherein the first current is proportional to absolute temperature.

10. The oscillator of claim 8, wherein the first current source comprises a first circuit for generating a third current having a positive temperature coefficient, and a second circuit mirroring the third current to the first current.

11. The oscillator of claim 10, wherein the first circuit comprises:

a first PMOS device:

a resistor having a first end and a second end, wherein the first end is connected to a drain of the first PMOS device;

a first diode connected to the second end of the resistor;

a second PMOS device having a gate connected to a gate of the first PMOS device;

a second diode connected to a drain of the second PMOS device, wherein the first diode has a saturation current greater than a saturation current of the second diode; and an operational amplifier having a first input connected to the drain of the first PMOS device, and a second input connected to the drain of the second PMOS device, and an output connected to the gates of the first and the second PMOS devices.

12. The oscillator of claim 11, wherein the first and the second diodes have an area ratio of between about 8 and about 40.

13. The oscillator of claim 11, wherein the second circuit comprises a PMOS device having a drain serially connected to the second current source, and a gate connected to the gates of the first and the second PMOS devices.

14. The oscillator of claim 8, wherein the second current source comprises a first circuit for generating a voltage having a negative temperature coefficient, and a second circuit for converting the voltage into a current having a negative temperature coefficient.

15. The oscillator of claim 14, wherein the first circuit comprises a diode connected in series with a resistive electrical device, wherein the voltage is a voltage drop on the diode.

16. The oscillator of claim 15, wherein the second circuit comprises:

an operational amplifier having a first input connected to a node between the diode and the resistive electrical device;

a resistor having a first end and a second end, wherein the first end is connected to a second input of the operational amplifier, and the second end is coupled to ground;

a first PMOS device having a gate connected to an output of the operational amplifier, and a drain connected to the first end of the resistor; and a second PMOS device having a gate connected to the output of the operational amplifier, and a drain serially connected to an NMOS device.

17. The oscillator of claim 14, wherein the second circuit comprises an NMOS device mirroring the current having the negative temperature coefficient.

18. An oscillator having a temperature-dependent frequency, the oscillator comprising:

a first current source comprising:

a first current path comprising a first MOS device serially coupled to a first diode and a first resistor;

a second current path comprising a second MOS device serially coupled to a second diode, wherein the first diode has an area greater than an area of the second diode;

an operational amplifier having a first input connected to the first current path, a second input connected to the second current path, and an output connected to gates of the first and the second MOS devices; and a third MOS device having a gate connected to the gates of the first and the second MOS devices, and a source coupled to a power source;

a second current source comprising:

a third diode serially connected to a resistive electrical device, wherein a node between the third diode and the resistive electrical device is at a reference voltage;

a circuit converting the reference voltage proportionally to a reference current; and a fourth MOS device generating a current proportional to the reference current, wherein a drain of the fourth MOS device is connected to a drain of the third MOS device; and a capacitor having a first end connected to the drains of the third and the fourth MOS devices, and a second end coupled to ground.

19. The oscillator of claim 18 further comprising a control circuit providing a discharging path for the capacitor after the capacitor is charged, wherein the discharging path is turned off after the capacitor is discharged.

20. The oscillator of claim 18, wherein the first and the second diode have an area ratio of between about 8 and about 100.

21. A method for generating a temperature-dependent oscillating signal, the method comprising:
   generating a first current having a positive temperature coefficient;
   generating a second current less than the first current and having a negative temperature coefficient; and
   subtracting the second current from the first current to generate a third current;
   charging a capacitor with the third current;
   discharging the capacitor when the voltage on the capacitor exceeds a predetermined threshold voltage; and
   outputting the temperature-dependent oscillating signal proportional to the capacitor voltage having a frequency with a positive temperature coefficient.

22. The method of claim 21 further comprising discharging the capacitor when a voltage drop on the capacitor is greater than a first voltage, and charging the capacitor when the voltage on the capacitor is lower than a second voltage.

23. The method of claim 21, wherein the step of generating the first current comprises:
   generating a fourth current having a positive temperature coefficient, wherein the fourth current is generated by biasing two current paths, each comprising a MOS device and a diode, wherein the diodes in the first and the second current path have different areas; and
   mirroring the fourth current to generate the first current.

24. The method of claim 21, wherein the step of generating the second current comprises:
   generating a voltage having a negative temperature coefficient;
   generating a fifth current proportional to the voltage; and
   mirroring the fifth current to generate the second current.

* * * * *

UNITED STATES PATENT AND TRADEMARK OFFICE
CERTIFICATE OF CORRECTION

PATENT NO. : 7,557,665 B2  
APPLICATION NO. : 11/717403  
DATED : July 7, 2009  
INVENTOR(S) : Chung et al.

Page 1 of 1

It is certified that error appears in the above-identified patent and that said Letters Patent is hereby corrected as shown below:

In Col. 6, line 21, delete "12" and insert --I2--.  
In Col. 6, line 22, delete "15" and insert --I5--.  
In Col. 6, line 23, delete "15" and insert --I5--.  
In Col. 6, line 24, delete "12" and insert --I2--.

Signed and Sealed this

First Day of September, 2009

David J. Kappos
*Director of the United States Patent and Trademark Office*